United States Patent
Lee et al.

(10) Patent No.: US 10,826,024 B2
(45) Date of Patent: Nov. 3, 2020

(54) ORGANIC LIGHT EMITTING DIODE LIGHTING APPARATUS AND METHOD OF FABRICATING THE SAME

(71) Applicant: LG Display Co., Ltd., Seoul (KR)

(72) Inventors: Kang-Ju Lee, Paju-si (KR); Tae-Shick Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/428,529

(22) Filed: May 31, 2019

(65) Prior Publication Data
US 2019/0372056 A1    Dec. 5, 2019

(30) Foreign Application Priority Data
May 31, 2018 (KR) .................. 10-2018-0062431

(51) Int. Cl.
*H01L 51/52* (2006.01)
*H01L 51/56* (2006.01)
(52) U.S. Cl.
CPC ...... *H01L 51/5275* (2013.01); *H01L 51/5212* (2013.01); *H01L 51/5253* (2013.01); *H01L 51/56* (2013.01); *H01L 2251/5361* (2013.01)
(58) Field of Classification Search
CPC ......... H01L 2251/5361; H01L 51/5212; H01L 51/5253; H01L 51/5257; H01L 51/56; H01L 51/5225; H01L 51/5268; H01L 2251/5362
See application file for complete search history.

(56) References Cited

U.S. PATENT DOCUMENTS

| | | | | |
|---|---|---|---|---|
| 2010/0258821 A1* | 10/2010 | Forrest | ............... | H01L 51/5271 257/88 |
| 2013/0020018 A1* | 1/2013 | Song | ................... | C23C 14/048 156/230 |
| 2014/0145585 A1* | 5/2014 | Choi | ................... | H01L 51/5259 313/504 |
| 2015/0144890 A1* | 5/2015 | Ma | ..................... | H01L 51/5275 257/40 |
| 2019/0363275 A1* | 11/2019 | Ochi | ..................... | H05B 33/04 |

* cited by examiner

*Primary Examiner* — Caridad Everhart
(74) *Attorney, Agent, or Firm* — Birch, Stewart, Kolasch & Birch, LLP

(57) ABSTRACT

An organic light emitting diode lighting apparatus can include a substrate having an emitting area and first and second non-emitting areas; an auxiliary electrode in the first non-emitting area on the substrate; an overcoating layer in the emitting area on the substrate, the overcoating layer having a microlens including a plurality of convex portions and a plurality of concave portions; a first electrode on the auxiliary electrode and the overcoating layer, the first electrode including at least one open portion exposing the overcoating layer in the second non-emitting area; a gas blocking pattern covering the at least one open portion; and a light emitting layer and a second electrode disposed on the first electrode and the gas blocking pattern.

21 Claims, 7 Drawing Sheets

ORGANIC LIGHT EMITTING DIODE LIGHTING APPARATUS AND METHOD OF FABRICATING THE SAME

CROSS REFERENCE TO RELATED APPLICATIONS

The present application claims the priority benefit of Korean Patent Application No. 10-2018-0062431 filed in Republic of Korea on May 31, 2018, which is hereby incorporated by reference in its entirety for all purposes as if fully set forth herein.

BACKGROUND OF THE INVENTION

Field of the Invention

The present invention relates to an organic light emitting diode lighting apparatus, and more particularly, to an organic light emitting diode lighting apparatus where a light extraction efficiency and a reliability are improved and a method of fabricating the organic light emitting diode lighting apparatus.

Discussion of the Related Art

An organic light emitting diode (OLED) display device includes two electrodes and a light emitting layer between the two electrodes on a substrate and displays an image by supplying an electric signal to the two electrodes.

The OLED display device has an excellent viewing angle and an excellent contrast ratio and a rapid response speed. In addition, the OLED display device has an advantage in power consumption. Since the OLED display device includes inner elements of a solid state, the OLED display device has a strong resistance to an external impact and a wide range in an operational temperature. As a result, an organic light emitting diode (OLED) lighting apparatus where an organic light emitting diode is used as a lighting apparatus has been the subject of recent research.

Although the OLED lighting apparatus is a planar light source, light emitted from the light emitting layer may be lost or blocked while passing through elements of the OLED lighting apparatus. As a result, the OLED lighting apparatus has a relatively small light extraction efficiency.

For example, an amount of the light confined in an interior of the OLED lighting apparatus due to a total reflection or an absorption by an anode is about 50% of the total light emitted from the light emitting layer, and an amount of the light confined in an interior of the OLED lighting apparatus due to a total reflection or an absorption by a substrate is about 30% of the total light emitted from light emitting layer. As a result, about 80% of the light emitted from the light emitting layer is confined in the interior of the OLED lighting apparatus and never escapes the device, and only about 20% of the light emitted from the light emitting layer is extracted to an exterior. Accordingly, the OLED lighting apparatus has a relatively small light extraction efficiency.

Since the amount of the light emitted from the light emitting layer increases according to a current applied to the OLED lighting apparatus, a luminance of the OLED lighting apparatus may increase due to application of a relatively high current to the light emitting layer. However, the power consumption of the OLED lighting apparatus increases and a lifetime of the OLED lighting apparatus is shortened.

Specifically, since a gaseous compound is generated in an organic layer under the electrode and not released to an exterior, the light emitting layer may be deteriorated by outgassing of the organic layer. As a result, the lifetime of the OLED lighting apparatus is shortened and a reliability of the OLED lighting apparatus is reduced.

SUMMARY OF THE INVENTION

Accordingly, the present invention is directed to an organic light emitting diode lighting apparatus and a method of fabricating the organic light emitting diode lighting apparatus that substantially obviates one or more of the problems due to limitations and disadvantages of the related art.

An object of the present invention is to provide an organic light emitting diode lighting apparatus where a light extraction efficiency is improved and reduction in reliability due to outgassing is prevented and a method of fabricating the organic light emitting diode lighting apparatus.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic light emitting diode lighting apparatus includes: a substrate having an emitting area and first and second non-emitting areas; an auxiliary electrode in the first non-emitting area on the substrate; an overcoating layer in the emitting area on the substrate, the overcoating layer having a microlens including a plurality of convex portions and a plurality of concave portions; a first electrode on the auxiliary electrode and the overcoating layer, the first electrode including at least one open portion exposing the overcoating layer in the second non-emitting area; a gas blocking pattern covering the at least one open portion; and a light emitting layer and a second electrode sequentially on the first electrode and the gas blocking pattern.

In another aspect, a method of fabricating an organic light emitting diode lighting apparatus includes: forming an auxiliary electrode in a first non-emitting area on a substrate; forming an overcoating layer in an emitting area on the substrate, the overcoating layer having a microlens including a plurality of convex portions and a plurality of concave portions; forming a first electrode on the auxiliary electrode and the overcoating layer, the first electrode including at least one open portion exposing the overcoating layer in a second non-emitting area; forming a gas blocking pattern covering the at least one open portion; forming a light emitting layer on the first electrode and the gas blocking pattern; and forming a second electrode on the light emitting layer.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the present disclosure, examples of which are illustrated in the accompanying drawings.

Figure 1:
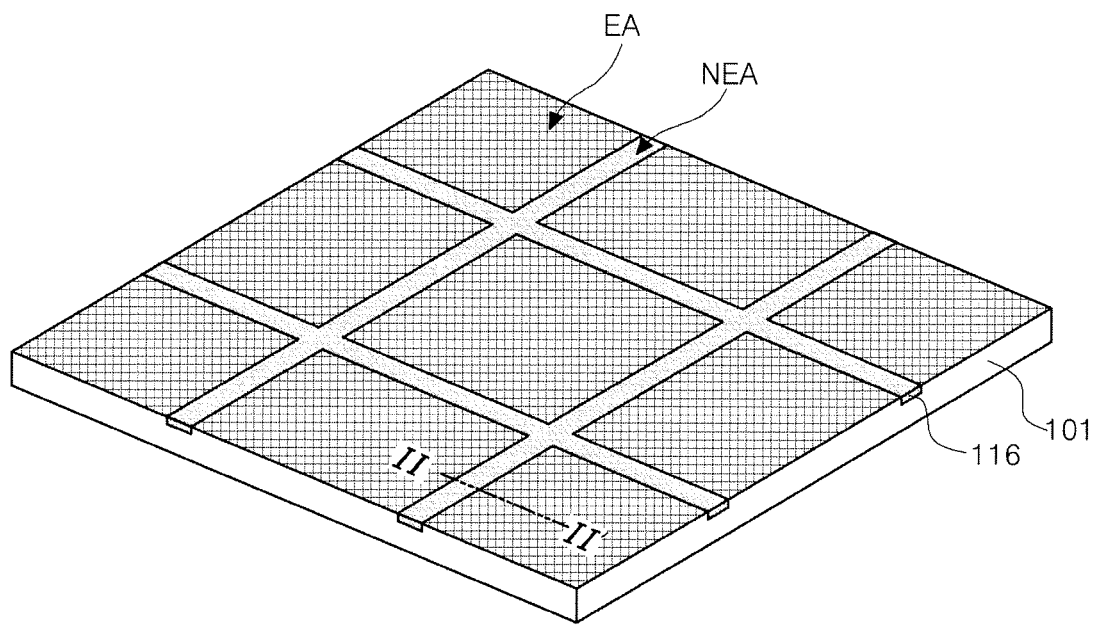
FIG. 1 is a perspective view showing an organic light emitting diode lighting apparatus according to an embodiment of the present disclosure.

FIG. 1 is a perspective view showing an organic light emitting diode lighting apparatus according to a first embodiment of the present disclosure.

In FIG. 1, an organic light emitting diode (OLED) lighting apparatus 100 includes a substrate 101 where a plurality of emitting areas EA and a plurality of non-emitting areas NEA are defined.

Figure 2:
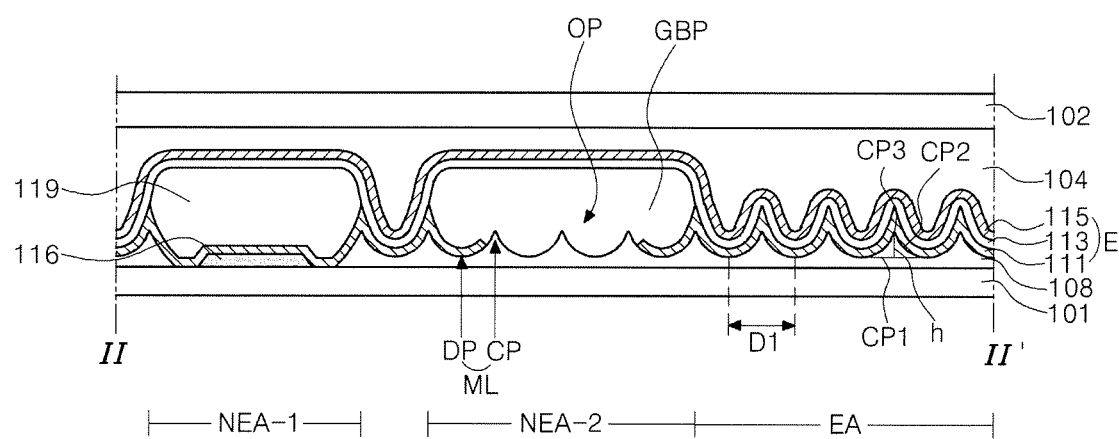
FIG. 2 is a cross-sectional view taken along a line II-II' of FIG. 1.

An auxiliary electrode 116 can be disposed in the non-emitting area NEA between the adjacent emitting areas EA to prevent a voltage drop (IR drop) in a first electrode 111 (of FIG. 2).

The auxiliary electrode 116 can have a mesh structure where the auxiliary electrode 116 is disposed along the plurality of non-emitting areas NEA in a matrix shape. However, the structure of the auxiliary electrode 116 may not be limited thereto.

For example, application of a voltage to the first electrode 111 from four directions through the auxiliary electrode 116 of a mesh structure can be more effective than application of a voltage to the first electrode 111 from one direction through the auxiliary electrode 116 of a stripe structure in prevention of the voltage drop of the first electrode 111.

The OLED lighting apparatus 100 further includes an overcoating layer 108 (of FIG. 2) having a microlens ML (of FIG. 2) and a light emitting diode E (of FIG. 2) on the substrate 101 having the auxiliary electrode 116. The overcoating layer 108 and the light emitting diode E can be illustrated with reference to FIG. 2.

FIG. 2 is a cross-sectional view taken along a line II-II' of FIG. 1.

In FIG. 2, the OLED lighting apparatus 100 (of FIG. 1) can include the substrate 101, the auxiliary electrode 116 and the overcoating layer 108 on the substrate 101, the light emitting diode E on the auxiliary electrode 116 and the overcoating layer 108 and a protecting film 102 for encapsulation on the light emitting diode E.

For example, the plurality of emitting areas EA and first and second non-emitting areas (NEA-1, NEA-2) can be defined on the substrate 101. The plurality of emitting areas EA function as a transparent area where a light penetrates. As a result, a light emitted from a light emitting layer 113 passes through the plurality of emitting areas EA to be emitted to an exterior.

The auxiliary electrode 116 can be disposed on the substrate 101 to correspond to the first non-emitting area NEA-1.

The auxiliary electrode 116 is connected to the first electrode 111 to prevent the voltage drop (IR drop) of the first electrode 111.

The auxiliary electrode 116 can have a mesh structure along the first non-emitting area NEA-1 on an entire surface of the substrate 101. However, the structure of the auxiliary electrode 116 may not be limited thereto.

The overcoating layer 108 can be disposed on the substrate 101 to correspond to the plurality of emitting areas EA.

A top surface of the overcoating layer 108 includes a plurality of concave portions DP and a plurality of convex portions CP alternating with each other to constitute the microlens ML. Each of the plurality of concave portions DP can have a half circular shape or a half elliptical shape in a cross-sectional view. However, the cross-sectional shape of each of the plurality of concave portions DP is not limited thereto.

The plurality of convex portions CP can have a structure to define or surround the plurality of concave portions DP, respectively, and can have a bottom surface portion CP1, a side surface portion CP2 and a top surface portion CP3. The side surface portion CP2 can be a whole of a slanted surface constituting the top surface portion CP3. A slope of the side surface portion CP2 can increase from the bottom surface portion CP1 to the top surface portion CP3 such that the side surface portion CP2 can have a maximum slope at a portion adjacent to the top surface portion CP3.

A diameter D1 of each of the plurality of convex portions CP is defined as a horizontal length of the bottom surface portion CP1. For example, the diameter D1 of each of the plurality of convex portions CP can be within a range of about 1 μm to about 5 μm. However, the diameter D1 of each of the plurality of convex portions CP is not limited thereto.

A height "h" of each of the plurality of convex portions CP is defined as a vertical length from the bottom surface portion CP1 to the top surface portion CP3. For example, the height "h" of each of the plurality of convex portions CP can be within a range of about 0.6 μm to about 1.3 μm. However, the height "h" of each of the plurality of convex portions CP is not limited thereto. Although the plurality of convex portions CP are connected to each other through the plurality of concave portions DP in FIG. 2, the plurality of convex portions CP can be connected to each other through a flat gap portion having a distance of about 1 μm to about 2 μm in another embodiment (e.g., the convex portions CP can be spaced apart from each other). The bottom surface portions CP1 of the plurality of convex portions CP can be disposed to be separated from each other by the gap portion.

Each of the plurality of concave portions DP can have various shapes, such as a hexagonal shape, a half circular shape, a circular shape, a half elliptical shape and a rectangular shape in a plan view.

The overcoating layer 108 can include an insulating material having a refractive index of about 1.5. For example, the overcoating layer 108 can include one of acrylic resin, epoxy resin, phenol resin, polyamide resin, polyimide resin, unsaturated polyester resin, polyphenylene resin, benzocyclobutene and photoresist.

The first electrode 111 can be disposed on the auxiliary electrode 116 and the overcoating layer 108.

The first electrode 111 can be an anode supplying an electron to the light emitting layer 113 or a cathode supplying a hole to the light emitting layer 113.

Here, the OLED lighting apparatus 100 where the first electrode 111 is an anode will be illustrated hereinafter as an example.

The first electrode 111 can include a material having a relatively high work function. The first electrode 111 can include a metallic compound, such as indium tin oxide (ITO) and indium zinc oxide (IZO), a mixture of a metal and an oxide such as ZnO:Al and $SnO_2$:Sb, or a conductive polymer such as poly(3-methylthiophene), poly[3,4-(ethylene-1,2-dioxy)thiophene] (PEDT), polypyrrole and polyanilline. In addition, the first electrode 111 can include carbon nano tube (CNT), graphene or silver nano wire.

The first electrode 111 is disposed on an entire surface of the substrate 101 including the plurality of emitting areas EA and the first and second non-emitting areas NEA-1 and NEA-2. In addition, the first electrode 111 contacts and is connected to the auxiliary electrode 116 in the first non-emitting area NEA-1.

The first electrode 111 can have a shape according to a morphology of a top surface of the overcoating layer 108 and the auxiliary electrode 116. For example, the first electrode 111 can have the same shape as a morphology of the plurality of concave portions DP and the plurality of convex portions CP of the overcoating layer 108 and the auxiliary electrode 116 (e.g., the first electrode can have a pitted or wavy shape that follows the contours of the overcoating layer 108).

Specifically, the first electrode 111 can have an open portion OP exposing the overcoating layer 108 in the OLED lighting apparatus 100. The open portion OP exposes at least one of the plurality of convex portions CP and the plurality of concave portions DP. For example, the open portion OP can expose a part of each convex portion CP and a part of each concave portion DP.

The open portion OP of the first electrode 111 can release a gaseous compound generated in the overcoating layer 108 due to heat or external light during a curing step. Although the open portion OP can have a bar shape or an island shape in a plan view in the first embodiment, the planar shape of the open portion OP is not limited thereto.

A bank 119 can be disposed on the first electrode 111 in the first non-emitting area NEA-1 to correspond to the auxiliary electrode 116.

Although the bank 119 can include an organic material having a refractive index smaller than about 1.6, such as photoacryl, the bank 119 is not limited thereto.

A gas blocking pattern GBP can be disposed on the first electrode 111 to cover the open portion OP of the first electrode 111 in the OLED lighting apparatus 100.

The gas blocking pattern GBP covering the open portion OP of the first electrode 111 blocks the residual gaseous compound which is not completely released through the open portion OP of the first electrode 111 in the previous curing step. Since the gaseous compound of the overcoating layer 108 released toward the light emitting layer 113 and the second electrode 115 is reduced, shrinkage of the light emitting layer 113 due to deterioration caused by outgassing is effectively prevented (e.g., the open portion OP can help vent the gaseous compound of the overcoating layer 108 away from the light emitting layer 113).

A width of the gas blocking pattern GBP can be greater than a width of the open portion OP.

The gas blocking pattern GBP can include the same material as the bank 119. When the gas blocking pattern GBP and the bank 119 include the same material, the gas blocking pattern GBP can be formed through the forming step of the bank 119 without an additional step.

A region where the gas blocking pattern GBP is disposed is defined as the second non-emitting area NEA-2.

The light emitting layer 113 can be disposed on the bank 119, the gas blocking pattern GBP and the first electrode 111.

The light emitting layer 113 can have a shape according to a morphology of a top surface of the bank 119, the gas blocking pattern GBP and the first electrode 111 (e.g., the light emitting layer 113 can be disposed across the bank 119, the gas blocking pattern GBP and the first electrode 111 and have a shape that follows the contours of the bank 119, the gas blocking pattern GBP and the first electrode 111).

The light emitting layer 113 can have a single layer of an organic emitting material or a multiple layer of an organic emitting material including a hole injecting layer, a hole transporting layer, an emitting material layer, an electron transporting layer and an electron injecting layer.

The second electrode 115 can be disposed on the light emitting layer 113.

Here, the OLED lighting apparatus 100 where the second electrode 115 is a cathode will be illustrated hereinafter as an example.

The second electrode 115 can have a shape according to a morphology of a top surface of the light emitting layer 113.

The second electrode 115 can include a material having a relatively low work function. For example, the second electrode 115 can have a single layer of an alloy including a first metal such as silver (Ag) and a second metal such as magnesium (Mg), or a multiple layer of the alloy.

The first electrode 111, the light emitting layer 113 and the second electrode 115 constitute a light emitting diode E.

When a voltage is applied to the first and second electrodes 111 and 115 according to a signal, a hole injected from the first electrode 11 and an electrode injected from the second electrode 115 are transmitted to the light emitting layer 113 to constitute an exciton. When the exciton transitions from an excited state to a ground state, a light can be emitted from the light emitting layer 113 as a visible ray.

The light of the light emitting layer 113 can pass through the transparent first electrode 111 to be emitted toward an exterior.

The light confined in the interior of the light emitting layer 113 and the second electrode 115 due to a total reflection can be transmitted with an angle smaller than a critical angle of the total reflection by the microlens ML of the overcoating layer 108 to be extracted to the exterior by a multiple reflection.

Accordingly, an external quantum efficiency (EQE) increases, and the light extraction efficiency of the OLED lighting apparatus 100 is improved.

The protecting film 102 of a thin film type is disposed on the second electrode 115, and a face seal 104 is formed between the second electrode 115 and the protecting film 102. The face seal 104 can be formed on an entire surface of the second electrode 115 through a coating method, and the protecting film 102 and the substrate 101 can be attached to each other to encapsulating the OLED lighting apparatus 100. The face seal 104 can include one of a frit of a ceramic composition, an organic insulating material and a polymer.

In the OLED lighting apparatus 100, the voltage drop of the first electrode 111 is prevented by the auxiliary electrode 116.

Since the first electrode 111 of the light emitting diode E includes a transparent conductive material, the first electrode 111 has a relatively high resistivity as compared with a metallic material. Accordingly, as an area of the first electrode 111 increases, a current flowing a whole of the first electrode 111 becomes non-uniform.

Therefore, as the area of the first electrode 111 increases, a uniformity in luminance of the light emitted from the light emitting layer 113 between the first and second electrodes 111 and 115 is deteriorated.

Since the OLED lighting apparatus 100 includes the auxiliary electrode 116 having a mesh structure that contacts the first electrode, the auxiliary electrode 116 supplements the relatively low electric conductivity of the first electrode 111 and non-uniformity in luminance of the light emitted from the light emitting layer 113 of the whole OLED lighting apparatus 100 is prevented.

The current flowing the whole first electrode 111 becomes uniform due to the auxiliary electrode 116 even when the area of the first electrode 111 is enlarged. As a result, the voltage drop of the first electrode 111 is prevented.

Accordingly, the non-uniformity in luminance of the image and the increase of the power consumption by the voltage difference between near and far regions with respect to a portion where the power is input due to the voltage drop are prevented.

Further, in the OLED lighting apparatus 100, the overcoating layer 108 includes the microlens ML having the concave portion DP corresponding to the emitting area EA and the convex portion CP connecting the adjacent concave portions DP. As a result, the light confined in the interior of the light emitting layer 113 and the second electrode 115 due to a total reflection is transmitted with an angle smaller than a critical angle of the total reflection by the microlens ML of the overcoating layer 108 to be extracted to the exterior by a multiple reflection (e.g., more light is allowed to escape).

Accordingly, an external quantum efficiency (EQE) increases, and the light extraction efficiency of the OLED lighting apparatus 100 is improved.

In the OLED lighting apparatus 100, outgassing may occur due to the overcoating layer 108 having the microlens ML for improving the light extraction efficiency. The gaseous compound generated in the overcoating layer 108 due to a heat or an external light during a curing step is effectively released through the open portion OP of the first electrode 111.

Further, the gas blocking pattern GBP covering the open portion OP of the first electrode 111 blocks the residual gaseous compound which is not completely released through the open portion OP of the first electrode 111 in the previous curing step. As a result, the gaseous compound of the overcoating layer 108 released toward the light emitting layer 113 and the second electrode 115 is reduced, and shrinkage of the light emitting layer 113 due to deterioration caused by the outgassing is effectively prevented.

Figure 3A:
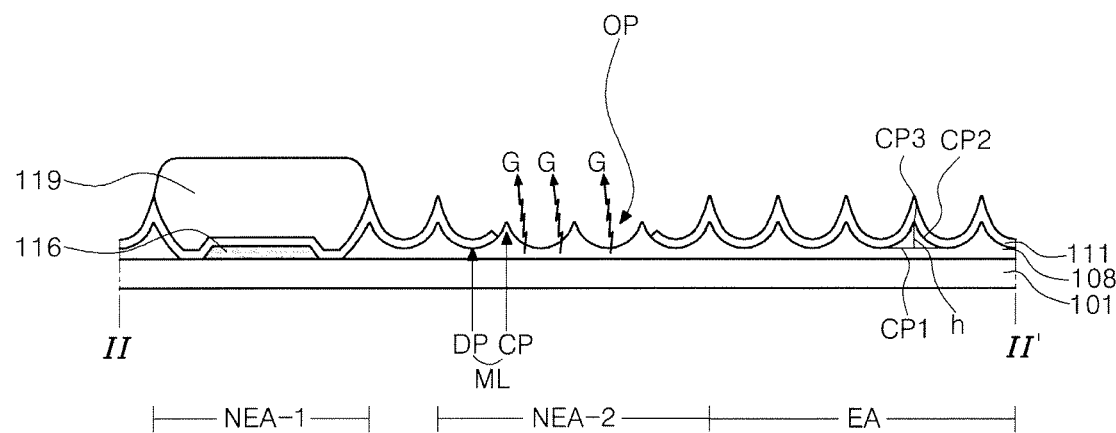
FIG. 3A is a cross-sectional view showing an outgassing through an open portion in an organic light emitting diode lighting apparatus according to an embodiment of the present disclosure.
Figure 3B:
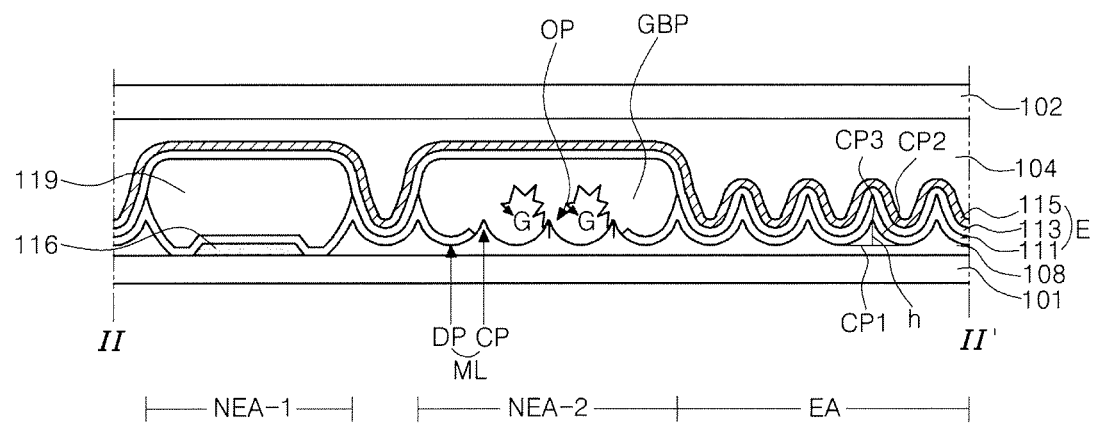
FIG. 3B is a cross-sectional view showing a blocking of an outgassing due to a gas blocking pattern in an organic light emitting diode lighting apparatus according to an embodiment of the present disclosure.

FIG. 3A is a cross-sectional view showing an outgassing through an open portion in an organic light emitting diode lighting apparatus according to a first embodiment of the present disclosure, and FIG. 3B is a cross-sectional view showing a blocking of an outgassing due to a gas blocking pattern in an organic light emitting diode lighting apparatus according to a first embodiment of the present disclosure.

In FIG. 3A, the auxiliary electrode 116 can be disposed on the substrate 101 to correspond to the first non-emitting area NEA-1, and the overcoating layer 108 having the microlens ML including the concave portion DP corresponding to the emitting area EA and the convex portion CP connecting the adjacent concave portions DP can be disposed on the substrate 101.

The first electrode 111 can have the same shape as a morphology of the overcoating layer 108 and the auxiliary electrode 116 and can include the open portion OP exposing the overcoating layer 108.

The region where the open portion OP of the first electrode 111 is disposed is defined as the second non-emitting area NEA-2.

Since the overcoating layer 108 includes an organic material, a gaseous compound G may be generated in the overcoating layer 108 due to a heat of a curing step or an external light.

In the OLED lighting apparatus 100, the light emitting layer 113 may be deteriorated by the outgassing of the overcoating layer 108 of an organic material layer.

The overcoating layer 108 adjacent to the light emitting layer 113 includes an organic material such as an acrylic resin or a polyimide resin. The acrylic resin or the polyimide resin generates a gaseous compound G such as N-methyl-2-pyrrolidone (NMP) or hexanitrile partially having a negative charge due to a heat applied during the curing step. For example, a nitrile group (—CN) of hexanitrile has a charge distribution where a positive charge is blocked by carbon atoms and a negative charge protrudes from an outer shell.

The gaseous compound G having a negative charge can be released from the overcoating layer 108 to the exterior along the arrow of FIG. 3A. However, since the first electrode 111 is formed on the overcoating layer 108, some amount of the gaseous compound G may not be released to the exterior to remain in the overcoating layer 108. When the light emitting layer 113 is formed on the first electrode 111 after the curing step, the residual gaseous compound G in the overcoating layer 108 may react with the light emitting layer 113.

The gaseous compound G may react with a material having a positive charge of the lowermost hole injecting layer of the light emitting layer 113, and the material of the hole injecting layer may lose the positive charge. As a result, the hole injecting layer may not effectively inject a hole to the light emitting layer 113.

When the charge due to the outgassing remains in the overcoating layer 108, the light emitting layer 113 may be deteriorated and a pixel shrinkage phenomenon due to the deterioration of the light emitting layer 113 may occur. As a result, a lifetime of the OLED lighting apparatus 100 may be reduced.

In the OLED lighting apparatus 100, since the first electrode 111 has the open portion OP, the gaseous compound G of the overcoating layer 108 can be released through the open portion OP during the curing step.

Since the gaseous compound G of the overcoating layer 108 releasing toward the light emitting layer 113 and the second electrode 115 is reduced, the shrinkage phenomenon of the light emitting layer 113 due to the deterioration caused by the outgassing is effectively prevented.

In FIG. 3B, the gas blocking pattern GBP can be disposed on the first electrode 111 to cover the open portion OP of the first electrode 111 in the second non-emitting area NEA-2.

The gas blocking pattern GBP blocks the residual gaseous compound which is not completely released through the open portion OP of the first electrode 111 in the previous curing step. Since the gaseous compound of the overcoating layer 108 released toward the light emitting layer 113 and the second electrode 115 is reduced, the shrinkage phenomenon of the light emitting layer 113 due to deterioration caused by the outgassing is effectively prevented.

In the OLED lighting apparatus 100, the gaseous compound G in the overcoating layer 108 is sufficiently released to the exterior through the open portion OP of the first electrode 111 during the curing step, and the open portion OP of the first electrode 111 is blocked by the gas blocking pattern GBP after the curing step.

Most of the gaseous compound G generated in the overcoating layer 108 of the OLED lighting apparatus 100 can be released to the exterior through the open portion OP of the first electrode 111 during the curing step, and the gaseous compound G may not remain in the overcoating layer 108 after the curing step. However, as the OLED lighting apparatus 100 is driven for a relatively long time, the gaseous compound G may be regenerated in the overcoating layer 108.

The gaseous compound G is slowly released from the overcoating layer 108. For example, the gaseous compound G may be released through the open portion OP to react with the light emitting layer 113. In the OLED lighting apparatus 100, since the gas blocking pattern GBP is disposed on the open portion OP, the reaction of the gaseous compound G generated in the overcoating layer 108 with the light emitting layer 113 is prevented.

In a first step, the gaseous compound G generated in the overcoating layer 108 due to the heat or the external light of the curing step is effectively released to the exterior through the open portion OP of the first electrode 111. In a second step, the residual gaseous compound G that are not completely released through the open portion OP of the first electrode 111 is blocked by the gas blocking pattern GBP (e.g., the gas blocking pattern GBP can effectively separate the light emitting layer 113 far enough away from any residual gaseous compound G vented by the open portion OP and block such gases from reacting with the light emitting layer 113). The shrinkage phenomenon of the light emitting layer 113 due to deterioration caused by the outgassing can be effectively prevented through the first and second steps.

Figure 4A:
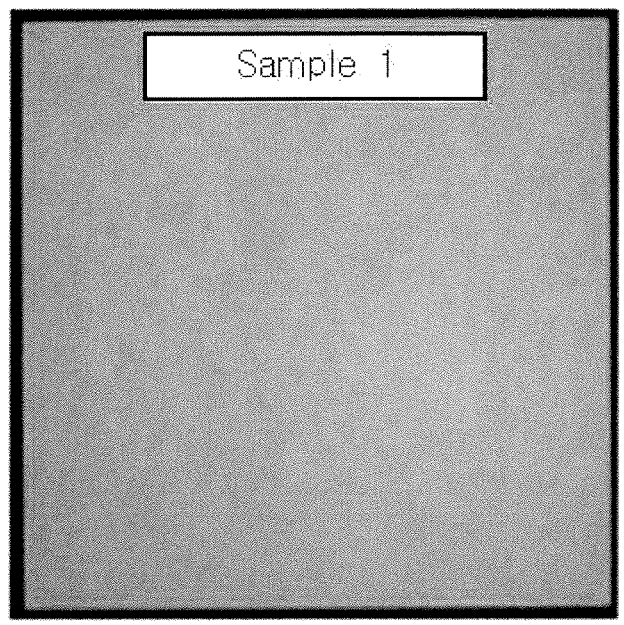
FIGS. 4A and 4B are photographs showing a shrinkage phenomenon due to deterioration in an organic light emitting diode lighting apparatus according to the related art.
Figure 4B:
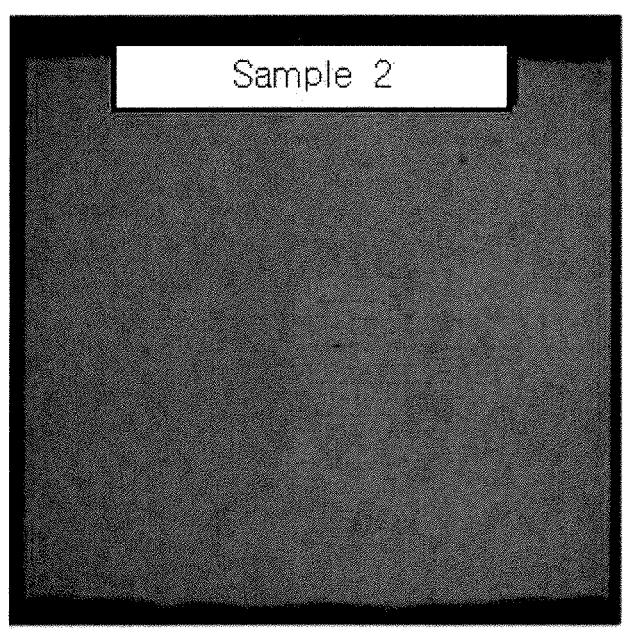
Figure 4C:
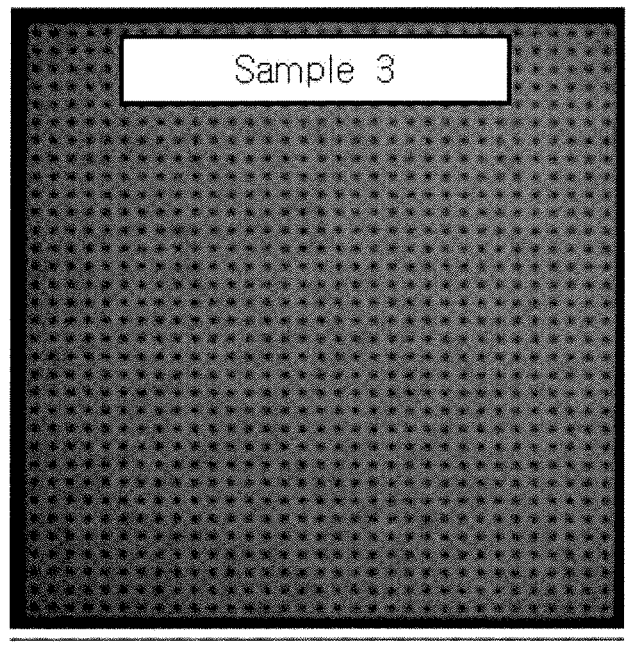
FIGS. 4C and 4D are photographs showing a shrinkage phenomenon due to deterioration in an organic light emitting diode lighting apparatus according to an embodiment of the present disclosure.
Figure 4D:
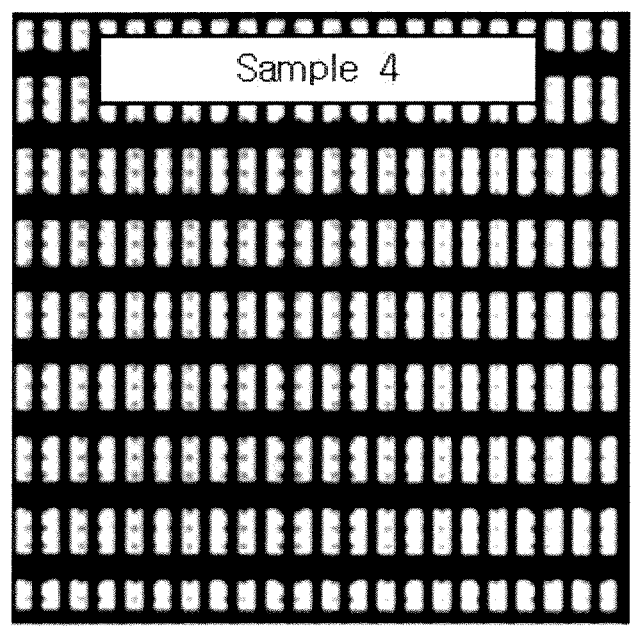

FIGS. 4A and 4B are photographs showing a shrinkage phenomenon due to deterioration in an organic light emitting diode lighting apparatus according to the related art, and FIGS. 4C and 4D are photographs showing a shrinkage phenomenon due to deterioration in an organic light emitting diode lighting apparatus according to a first embodiment of the present disclosure.

A sample 1 of FIG. 4A is an experimental photograph measuring a shrinkage phenomenon of an OLED lighting apparatus, and a sample 2 of FIG. 4B is an experimental photograph measuring a shrinkage phenomenon of an OLED lighting apparatus including an overcoating layer of a microlens.

A sample 3 of FIG. 4C is an experimental photograph measuring a shrinkage phenomenon of an OLED lighting apparatus including an overcoating layer of a microlens and a first electrode having an open portion before a gas blocking pattern is formed, and a sample 4 of FIG. 4D is an experimental photograph measuring a shrinkage phenomenon of an OLED lighting apparatus including a gas blocking pattern on an open portion of a first electrode after the OLED lighting apparatus is driven for a relatively long time.

In FIG. 4A, the shrinkage phenomenon is not found in the OLED lighting apparatus according to the related art. In FIG. 4B, the shrinkage phenomenon is found in an edge region of the OLED lighting apparatus.

As a result, when the OLED lighting apparatus includes the overcoating layer having the microlens for improving the light extraction efficiency, the shrinkage phenomenon of the light emitting layer due to the deterioration caused by the gaseous compound generated in the overcoating layer occurs.

In FIGS. 4C and 4D, the shrinkage phenomenon is not found in the OLED lighting apparatus according to a first embodiment of the present disclosure. In the OLED lighting apparatus according to a first embodiment of the present disclosure, since the first electrode includes the open portion, the shrinkage phenomenon of the light emitting layer 113 due to deterioration caused by the outgassing is effectively prevented even when the OLED lighting apparatus includes the overcoating layer having a microlens for improving the light extraction efficiency.

In FIG. 4D, specifically, since the gas blocking pattern is formed on the open portion of the first electrode, the shrinkage phenomenon does not occur even when the OLED lighting apparatus is driven for a relatively long time.

Figure 5:
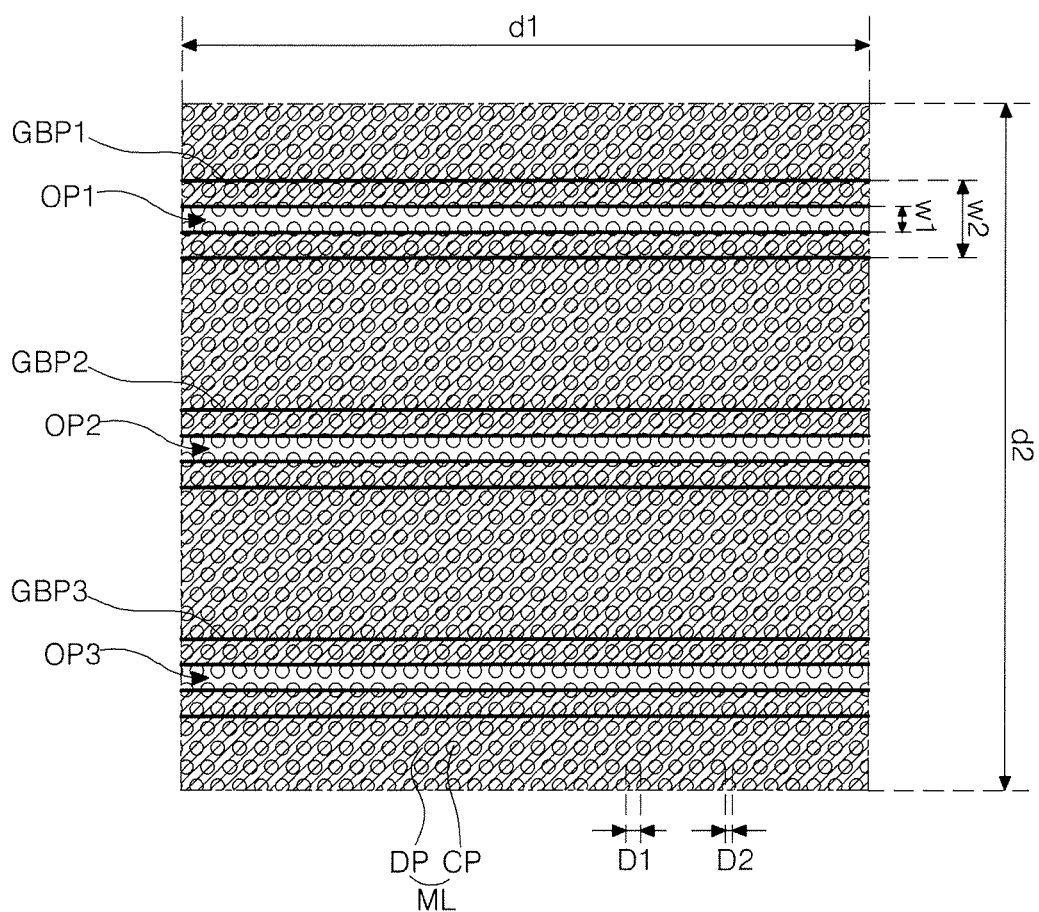
FIG. 5 is a plan view showing an emitting area of an organic light emitting diode lighting apparatus according to an embodiment of the present disclosure.

FIG. 5 is a plan view showing an emitting area of an organic light emitting diode lighting apparatus according to a first embodiment of the present disclosure.

In FIG. 5, the overcoating layer 108 (of FIG. 2) is disposed in the emitting area EA (of FIG. 1) on the substrate 101 (of FIG. 2) of the OLED lighting apparatus 100 (of FIG. 1) and the first electrode 111 (of FIG. 2) is disposed on the overcoating layer 108. The overcoating layer 108 can include the plurality of concave portions DP and the plurality of convex portions CP corresponding to the emitting area EA. The plurality of concave portions DP and the plurality of convex portions CP can alternate with each other to constitute the microlens ML.

The diameter D1 of each of the plurality of convex portions CP can be within a range of about 1 μm to about 5 μm. However, the diameter D1 of each of the plurality of convex portions CP is not limited thereto.

The plurality of convex portions CP can be separated from each other by a gap distance D2 of about 1 μm to about 2 μm. The disposition of the plurality of convex portions CP is not limited thereto. The plurality of convex portions CP can be connected to each other in another embodiment.

Each of the plurality of concave portions DP can have a circular shape in a plan view. The shape of each of the plurality of concave portions DP is not limited thereto. The plurality of concave portions DP can have various shapes, such as a hexagonal shape, a half circular shape, a half elliptical shape and a rectangular shape in a plan view.

The first electrode 111 can include first, second and third open portions OP1, OP2 and OP3 exposing the overcoating layer 108.

Each of the first, second and third open portions OP1, OP2 and OP3 can have a bar shape in a plan view and the first, second and third open portions OP1, OP2 and OP3 may be separated from each other.

In the OLED lighting apparatus 100, the first, second and third open portions OP1, OP2 and OP3 can have an area smaller than about 10% of the area of the whole emitting area EA except for the first non-emitting area NEA-1 (of FIG. 2). When the area of the first, second and third open portions OP1, OP2 and OP3 is greater than or equal to about 10% of the area of the whole emitting area EA, the area of the second non-emitting area NEA-2 (of FIG. 2) is enlarged to reduce the light extraction efficiency of the OLED lighting apparatus 100.

As a result, the area of the first, second and third open portions OP1, OP2 and OP3 can be smaller than about 10% of the area of the whole emitting area EA for the effective outgassing preventing deterioration of the light emitting layer 113 (of FIG. 2) and the effective light extraction efficiency.

For example, when the emitting area EA has a size of about 135 µm (d1) X about 135 µm (d2), each of the first, second and third open portions OP1, OP2 and OP3 can have a width (w1) of about 4 µm to about 4.5 µm such that the area of the first, second and third open portions OP1, OP2 and OP3 is about 8% to about 10% of the area of the whole emitting area EA. Although the OLED lighting apparatus 100 includes the second non-emitting area NEA-2 corresponding to the open portion OP of the first electrode 111, the light extraction efficiency can be compensated by the overcoating layer 108 having the microlens ML. Accordingly, the resultant light extraction efficiency of the OLED lighting apparatus 100 may not be influenced by the second non-emitting area NEA-2 corresponding to the open portion OP of the first electrode 111.

The first, second and third gas blocking patterns GBP1, GBP2 and GBP3 can be disposed on the first, second and third open portions OP1, OP2 and OP3, respectively, of the first electrode 111. The first, second and third gas blocking patterns GBP1, GBP2 and GBP3 can cover the first, second and third open portions OP1, OP2 and OP3, respectively.

The first, second and third gas blocking patterns GBP1, GBP2 and GBP3 can correspond to the first, second and third open portions OP1, OP2 and OP3, respectively, and each of the first, second and third gas blocking patterns GBP1, GBP2 and GBP3 can have a bar shape in a plan view.

The first, second and third gas blocking patterns GBP1, GBP2 and GBP3 can be separated from each other.

A width w2 of each of the first, second and third gas blocking patterns GBP1, GBP2 and GBP3 can be greater than a width w1 of each of the first, second and third open portions OP1, OP2 and OP3 such that the gaseous compound G (of FIG. 3B) of the overcoating layer 108 is not released through the first, second and third open portions OP1, OP2 and OP3. For example, the open portions can act like vents to vent reactive gases away from the emitting layer, and the gas block patterns can act like buffers to protect the emitting layer from the dangerous vents.

The width w2 of each of the first, second and third gas blocking patterns GBP1, GBP2 and GBP3 can have a margin of about 5 µm with respect to the width w1 of each of the first, second and third open portions OP1, OP2 and OP3 such that the first, second and third gas blocking patterns GBP1, GBP2 and GBP3 completely cover the first, second and third open portions OP1, OP2 and OP3, respectively. Both sides of each of the first, second and third gas blocking patterns GBP1, GBP2 and GBP3 can be disposed by about 5 µm from both sides of the first, second and third open portions OP1, OP2 and OP3.

For example, when the emitting area EA has a size of about 135 µm (d1) X about 135 µm (d2) and each of the first, second and third open portions OP1, OP2 and OP3 has the width w1 of about 4 µm to about 4.5 µm, each of the first, second and third gas blocking patterns GBP1, GBP2 and GBP3 can have the width w2 of about 14 µm to about 14.5 µm.

The first, second and third gas blocking patterns GBP1, GBP2 and GBP3 can include the same material as the bank 119 (of FIG. 2). When the first, second and third gas blocking patterns GBP1, GBP2 and GBP3 and the bank 119 include the same material, the first, second and third gas blocking patterns GBP1, GBP2 and GBP3 can be formed through the forming step of the bank 119 without an additional step. In addition, the overcoating layer has been cured and vented with the open portions (e.g., like little volcanoes), then the gas blocking patterns can be formed on top of the open portions. In other words, the open portions can vent dangerous gas generated during manufacture of the display device so that the gas is not trapped and given a chance to react with the light emitting layer at a later time, then the gas blocking patterns can be formed on top of the open portions (e.g., like capping dormant volcanoes), in order to prevent any additional gas that is later generated during the lifetime of the display device from reaching the light emitting layer (e.g., additional gas generated from the overcoating layer after heavy use of the display device).

Figure 6:
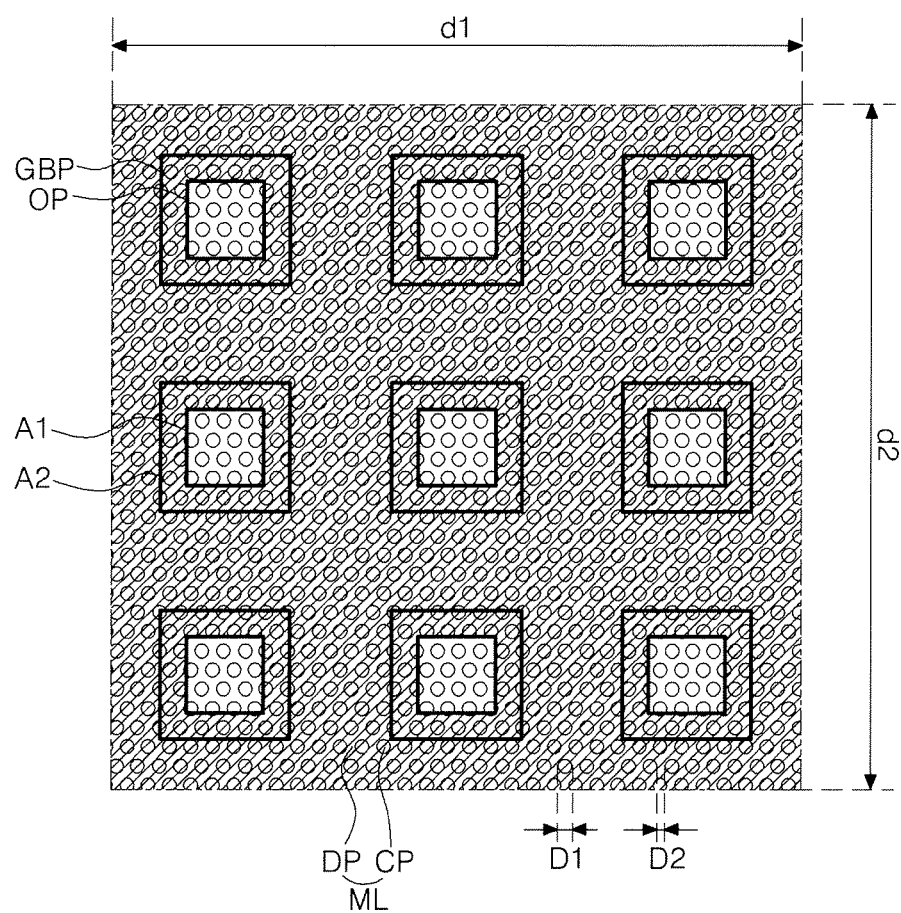
FIG. 6 is a plan view showing an emitting area of an organic light emitting diode lighting apparatus according to another embodiment of the present disclosure.

FIG. 6 is a plan view showing an emitting area of an organic light emitting diode lighting apparatus according to a second embodiment of the present disclosure. A part of the second embodiment the same as a part of the first embodiment may be designated by the same reference number.

In FIG. 6, the first electrode 111 (of FIG. 2) is disposed on the overcoating layer 108 (of FIG. 2) and includes a plurality of open portions OP exposing the overcoating layer 108.

Each of the plurality of open portions OP can have an island shape in a plane view and the plurality of open portions can be separated from each other.

The plurality of open portions OP can have an area smaller than about 10% of an area of the whole emitting area EA (of FIG. 1) for the effective outgassing and the effective light extraction efficiency. However, the area of the plurality of open portions OP is not limited thereto.

Each of the plurality of open portions OP can have a rectangular shape in a plan view. The shape of each of the plurality of open portions OP is not limited thereto. Each of the plurality of open portions OP can have various shapes, such as a hexagonal shape, a half circular shape, a half elliptical shape and a circular shape in a plan view.

A plurality of gas blocking patterns GBP can be disposed on the first electrode 111 to cover the plurality of open portions OP, respectively, of the first electrode 111.

Each of the plurality of gas blocking patterns GBP may have an island shape. The plurality of gas blocking patterns GBP may correspond to the plurality of open portions OP, respectively, and may be separated from each other. For example, the open portions OP and the gas blocking patterns GBP can be strategically and periodically placed throughout the micro lens structure of the overcoating layer and, according to a creative analogy, can be viewed similar to hydrothermal vents on the seafloor with designated buffer zones around each vent.

Each of the plurality of gas blocking patterns GBP can have a rectangular shape in a plan view corresponding to the plurality of open portions OP. However, the shape of the plurality of gas blocking patterns GBP is not limited thereto. Each of the plurality of gas blocking patterns GBP can have various shapes, such as a hexagonal shape, a half circular shape, a half elliptical shape and a circular shape in a plan view.

An area A2 of each of the plurality of gas blocking patterns GBP can be greater than an area A1 of each of the plurality of open portions OP such that the gaseous compound G (of FIG. 3B) of the overcoating layer 108 is not released through the plurality of open portions OP or is at least prevented from reaching the light emitting layer 113.

Since the OLED lighting apparatus 100 includes the auxiliary electrode 116 (of FIG. 2) having a mesh structure and contacting the first electrode 111, the auxiliary electrode 116 supplements the relatively low electric conductivity of the first electrode 111 and non-uniformity in luminance of the light emitted from the light emitting layer 113 (of FIG. 2) of the whole OLED lighting apparatus 100 is prevented.

Further, in the OLED lighting apparatus 100, the overcoating layer 108 includes the microlens ML (of FIG. 2) having the concave portion DP (of FIG. 2) corresponding to the emitting area EA and the convex portion CP (of FIG. 2) connecting the adjacent concave portions DP. As a result, the light confined in the interior of the light emitting layer 113 and the second electrode 115 due to a total reflection is transmitted with an angle smaller than a critical angle of the total reflection by the microlens ML of the overcoating layer 108 to be extracted to the exterior by a multiple reflection. Accordingly, an external quantum efficiency (EQE) increases, and the light extraction efficiency of the OLED lighting apparatus 100 is improved.

In the OLED lighting apparatus 100, the gaseous compound generated in the overcoating layer 108 due to a heat or an external light during a curing step is effectively released through the plurality of open portions OP of the first electrode 111. The plurality of gas blocking patterns GBP covering the plurality of open portions OP of the first electrode 111 block the residual gaseous compound which is not completely released through the plurality of open portions OP of the first electrode 111 in the previous curing step. As a result, the gaseous compound G of the overcoating layer 108 released toward the light emitting layer 113 and the second electrode 115 is reduced, and the shrinkage phenomenon of the light emitting layer 113 due to deterioration caused by the outgassing is effectively prevented.

In addition, the area of the plurality of open portions OP of the first electrode 111 can be smaller than about 10% of the area of the whole emitting area EA. As the disposition of the plurality of open portions OP is changed from an edge region to a center region, the number of the plurality of open portions OP decreases and the size of the plurality of open portions OP decreases.

Since the light is not substantially emitted from the plurality of open portions OP, the plurality of open portions OP can be defined as the second non-emitting area NEA-2 (of FIG. 3B). Accordingly, the number and the size of the plurality of open portions OP are reduced from the edge region to the center region such that the second non-emitting area NEA-2 is not recognized in the center region of the OLED lighting apparatus 100.

Specifically, when the plurality of open portions OP can be disposed adjacent to the first non-emitting area NEA-1 of the OLED lighting apparatus 100, the second non-emitting area NEA-2 defined by the plurality of open portions OP is not recognized and the outgassing effect is maximized.

Since the first electrode 111 and the auxiliary electrode 116 contact each other in the first non-emitting area NEA-1, the first electrode 111 of the first non-emitting area NEA-1 can have a relatively small thickness as compared to the first electrode 111 of the other region or can be cut. As a result, the gaseous compound G of the overcoating layer 108 can be concentrated to in the first non-emitting area NEA-1 to be released through the first non-emitting area NEA-1. However, since the bank 119 (of FIG. 3B) is disposed on the first electrode 111, the gaseous compound G is released through a region adjacent to the first non-emitting area NEA-1 such as an end region of the bank 119 instead of the first non-emitting area NEA-1.

As the plurality of open portions OP of the first electrode 111 is disposed further adjacent to the first non-emitting area NEA-1, the number and the size of the plurality of open portions OP increase in the first non-emitting area NEA-1 as compared to the other regions. As a result, the outgassing effect is maximized. When the second non-emitting area NEA-2 is disposed adjacent to the first non-emitting area NEA-1, the first and second non-emitting areas NEA-1 and NEA-2 can have a connected structure. In addition, the bank 119 and the plurality of gas blocking patterns GBP may have a connected structure.

Figure 7:
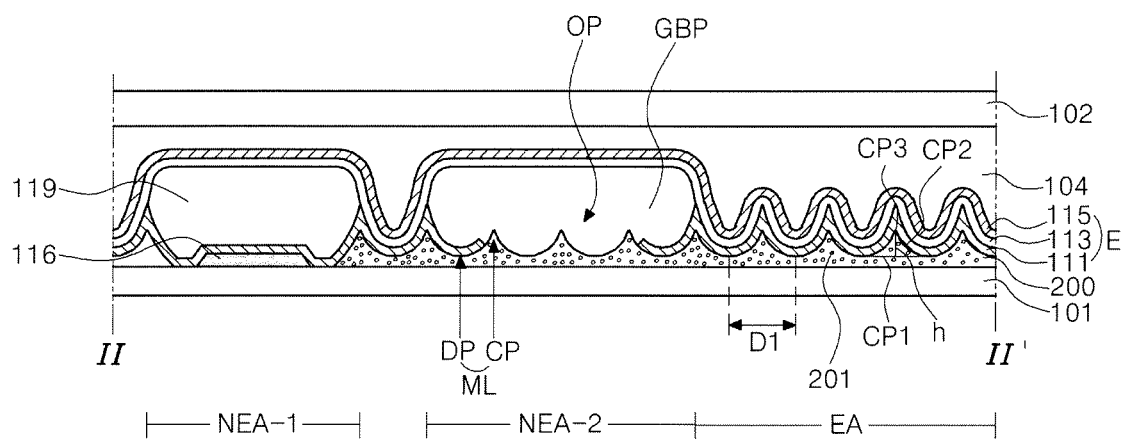
FIG. 7 is a cross-sectional view showing an organic light emitting diode lighting apparatus according to yet another embodiment of the present disclosure. A part of the third embodiment the same as a part of the first embodiment may be designated by the same reference number.

FIG. 7 is a cross-sectional view showing an organic light emitting diode lighting apparatus according to a third embodiment of the present disclosure. A part of the third embodiment the same as a part of the first embodiment may be designated by the same reference number.

In FIG. 7, the overcoating layer 200 can be a light scattering layer including a dispersing particle 201 for additional light extraction. The light extraction efficiency of the OLED lighting apparatus 100 (of FIG. 1) is further improved due to the overcoating layer 200.

In the OLED lighting apparatus 100, the first electrode 111 includes the plurality of open portions OP and plurality of the gas blocking patterns GBP are disposed on the plurality of open portions OP for outgassing of the overcoating layer 200. Since the plurality of open portions OP are defined as the second non-emitting area NEA-2, the emitting area EA may be reduced. However, since the light extraction efficiency is compensated by the overcoating layer 200 including the dispersing particle 201, the resultant light extraction efficiency of the OLED lighting apparatus 100 may not be influenced by the second non-emitting area NEA-2 corresponding to the plurality of open portions OP of the first electrode 111.

The overcoating layer 200 of the light scattering layer can include the dispersing particle 201 and a photosensitive resin for light extraction.

For example, the photosensitive resin can include an alkali soluble resin, an ethylenically unsaturated monomer, a dispersing solution for light extraction, a photoinitiator and a solvent.

To scatter the light emitted from the light emitting layer 113, a refractive index of the photosensitive resin of the overcoating layer 200 is different from a refractive index of the dispersing particle 201 of the overcoating layer 200. For example, the photosensitive resin and the dispersing particle 201 can have a refractive index difference equal to or greater than about 0.2.

When the photosensitive resin has a refractive index of about 1.4 to about 1.6, the dispersing particle 201 can include a metallic oxide having a refractive index equal to or greater than about 1.8, or a hollow particle including a body part having a refractive index equal to or smaller than about 1.2.

Since the overcoating layer 200 having the photosensitive resin is patterned through an exposure step, the overcoating layer 200 can be formed without an etching step. In addition, since the other elements of the OLED lighting apparatus 100 are not deteriorated by the exposure step, the overcoating layer 200 can be formed without deterioration of the other elements.

Consequently, in the OLED lighting apparatus according to the present disclosure, the light extraction efficiency is effectively improved due to the overcoating layer having the microlens.

In addition, since the shrinkage phenomenon due to the outgassing is prevented by the open portion of the first electrode and the gas blocking pattern covering the open portion, reliability is improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting diode lighting apparatus, comprising:
    a substrate having an emitting area and first and second non-emitting areas;
    an auxiliary electrode in the first non-emitting area on the substrate;
    an overcoating layer in the emitting area on the substrate, the overcoating layer having a microlens including a plurality of convex portions and a plurality of concave portions;
    a first electrode on the auxiliary electrode and the overcoating layer, the first electrode including at least one open portion exposing the overcoating layer in the second non-emitting area;
    a gas blocking pattern covering the at least one open portion; and
    a light emitting layer and a second electrode disposed on the first electrode and the gas blocking pattern,
    wherein the gas blocking pattern is disposed between the first electrode and the second electrode.

2. The apparatus of claim 1, wherein the light emitting layer and the second electrode are disposed across the emitting area, the first and second non-emitting areas, the gas blocking pattern and the auxiliary electrode,
    wherein the at least one open portion only extends through the first electrode,
    wherein the gas blocking pattern is disposed between the light emitting layer and the overcoating layer, and
    wherein the gas blocking pattern is disposed between the light emitting layer and at least a portion of the first electrode.

3. The apparatus of claim 1, wherein the first electrode corresponds to an entire surface of the substrate.

4. The apparatus of claim 1, wherein the at least one open portion exposes at least one of the plurality of convex portions and the plurality of concave portions.

5. The apparatus of claim 1, further comprising a bank between the auxiliary electrode and the light emitting layer.

6. The apparatus of claim 1, wherein an area of the at least one open portion is smaller than approximately 10% of an area of the emitting area.

7. The apparatus of claim 6, wherein the at least one open portion is disposed in each of a first region and a second region farther than the first region from the first non-emitting area, and a size of the at least one open portion in the first region is greater than a size of the at least one open portion in the second region.

8. The apparatus of claim 6, wherein the at least one open portion is disposed in each of a first region and a second region farther than the first region from the first non-emitting area, and a number of the at least one open portion in the first region is greater than a number of the at least one open portion in the second region.

9. The apparatus of claim 6, wherein the at least one open portion is disposed in an edge region and a center region of the substrate, and a size of the at least one open portion in the edge region is greater than a size of the at least one open portion in the center region.

10. The apparatus of claim 6, wherein the at least one open portion is disposed in an edge region and a center region of the substrate, and a number of the at least one open portion in the edge region is greater than a number of the at least one open portion in the center region.

11. The apparatus of claim 5, wherein the gas blocking pattern and the bank include a same material, and the gas blocking pattern and the bank are part of a same layer.

12. The apparatus of claim 1, wherein each of the at least one open portion and the gas blocking pattern has a bar shape, and a width of the gas blocking pattern is greater than a width of the at least one open portion.

13. The apparatus of claim 1, wherein each of the at least one open portion and the gas blocking pattern has an island shape, and an area of the gas blocking pattern is greater than an area of the at least one open portion.

14. The apparatus of claim 1, wherein the overcoating layer includes a photosensitive resin and a dispersing particle, and the photosensitive resin and the dispersing particle have a refractive index difference greater than or equal to 0.2.

15. The apparatus of claim 1, wherein the at least one open portion is configured to release a gaseous compound generated from the overcoating layer, and the gas blocking pattern is configured to block the gaseous compound from reaching the light emitting layer.

16. A method of fabricating an organic light emitting diode lighting apparatus, the method comprising:
    forming an auxiliary electrode in a first non-emitting area on a substrate;
    forming an overcoating layer in an emitting area on the substrate, the overcoating layer having a microlens including a plurality of convex portions and a plurality of concave portions;
    forming a first electrode on the auxiliary electrode and the overcoating layer, the first electrode including at least one open portion exposing the overcoating layer in a second non-emitting area;
    forming a gas blocking pattern covering the at least one open portion;
    forming a light emitting layer on the first electrode and the gas blocking pattern; and
    forming a second electrode on the light emitting layer.

17. The method of claim 16, wherein the forming the overcoating layer includes a curing step, and a gaseous compound generated from the overcoating layer is released through the at least one open portion during the curing step.

18. The method of claim 16, wherein a residual gaseous compound generated from the overcoating layer after forming the gas blocking pattern is blocked by the gas blocking pattern.

19. The method of claim 16, wherein the gas blocking pattern is formed on the at least open portion after venting a gaseous compound generated from the overcoating layer during a curing step.

20. An organic light emitting diode lighting apparatus, comprising:
    a substrate including an emitting area and a non-emitting area;

an overcoating layer disposed in the emitting area and the non-emitting area, the overcoating layer forming a micro lens including a plurality of convex portions or a plurality of concave portions;

a first electrode disposed on the overcoating layer, at least one open portion in the first electrode in an area overlapping with the overcoating layer in the non-emitting area;

a light emitting layer disposed on the first electrode;

a second electrode disposed on the light emitting layer; and a gas blocking pattern disposed on the at least one open portion in the first electrode, wherein the gas blocking pattern is disposed between the first electrode and the second electrode.

21. The apparatus of claim 1, wherein the gas blocking pattern contacts the first electrode and the overcoating layer exposed through the at least one open portion.

\* \* \* \* \*